Figure 1:
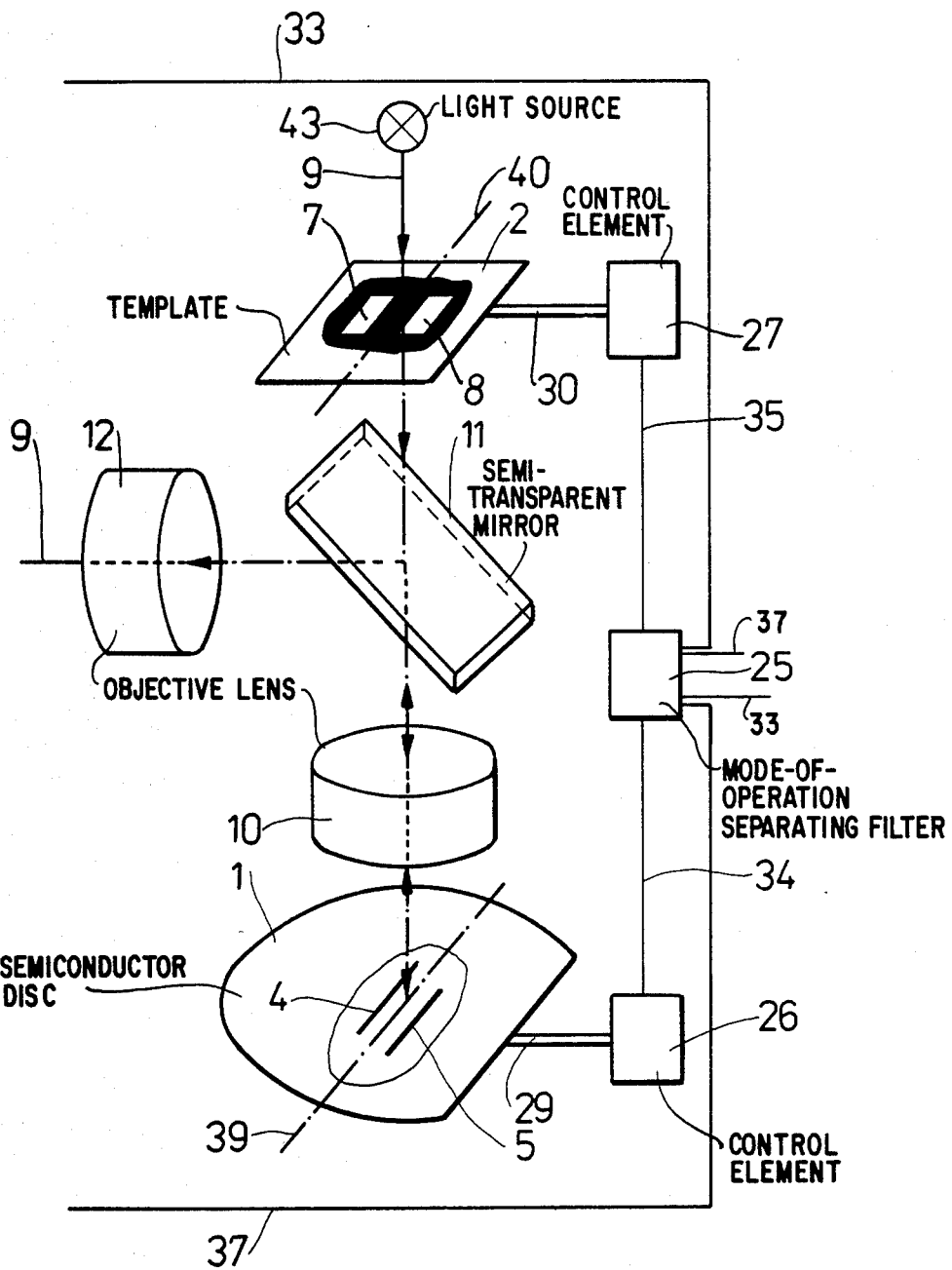

United States Patent [19]

Schorcht et al.

[11] Patent Number: 4,496,970
[45] Date of Patent: Jan. 29, 1985

[54] ARRANGEMENT FOR THE AUTOMATIC ADJUSTMENT OF AT LEAST ONE OBJECT

[75] Inventors: Adelbrecht Schorcht; Dietmar Klingenfeld, both of Jena; Reiner Hesse, Jena-Lobeda; Rainer Dastis, Jena-Lobeda; Volker Linz, Jena-Lobeda, all of German Democratic Rep.

[73] Assignee: Jenoptik Jena G.m.b.H., Jena, German Democratic Rep.

[21] Appl. No.: 293,038

[22] Filed: Aug. 14, 1981

[30] Foreign Application Priority Data

Nov. 3, 1980 [DD] German Democratic Rep. ... 224904

[51] Int. Cl.$^3$ ............................................. H04N 7/18
[52] U.S. Cl. .................................... 358/101; 358/107; 358/903
[58] Field of Search ..................... 358/101, 107, 903

[56] References Cited

U.S. PATENT DOCUMENTS

| | | | |
|---|---|---|---|
| 4,219,844 | 8/1980 | Ohsumi | 358/101 |
| 4,343,553 | 8/1982 | Nakagawa | 358/101 |
| 4,364,086 | 12/1982 | Guth | 358/101 |

*Primary Examiner*—Howard W. Britton
*Attorney, Agent, or Firm*—Jordan and Hamburg

[57] ABSTRACT

An arrangement for the automatic adjustment of at least one object, for instance a semiconductor disc and a template vis-a-vis a photoelectric measuring and scanning system, and of two objects in relation to each other in step-wise projection lithography for the manufacture of semiconductor structures.

The purpose of this invention is to provide a highly accurate and at the same time quickly adjustable means for the adjustment of two objects, under the selective utilization of the different adjustment marks presently used, based on the thereby influenced light currents as well as their structure.

An image of the adjustment marks of both objects is produced by means of an optical reproduction system in the scanning plane of a photoelectric measuring and scanning system, symmetrical to a stationary axis of this system.

For obtaining the image, two image segments are situated on the stationary axis and separated by an intermediary rod, which the image segments being produced with the aid of electronical or mechanical means. There is thus produced a two-beam process. Image scanning is effected by means of a television camera tube or movable slotted carriers, wherein the two image segments can be alternately employed for producing the image by channel switching.

The video signals are processed by a computer which releases control signals to the final control elements for adjustment of the two objects.

11 Claims, 11 Drawing Figures

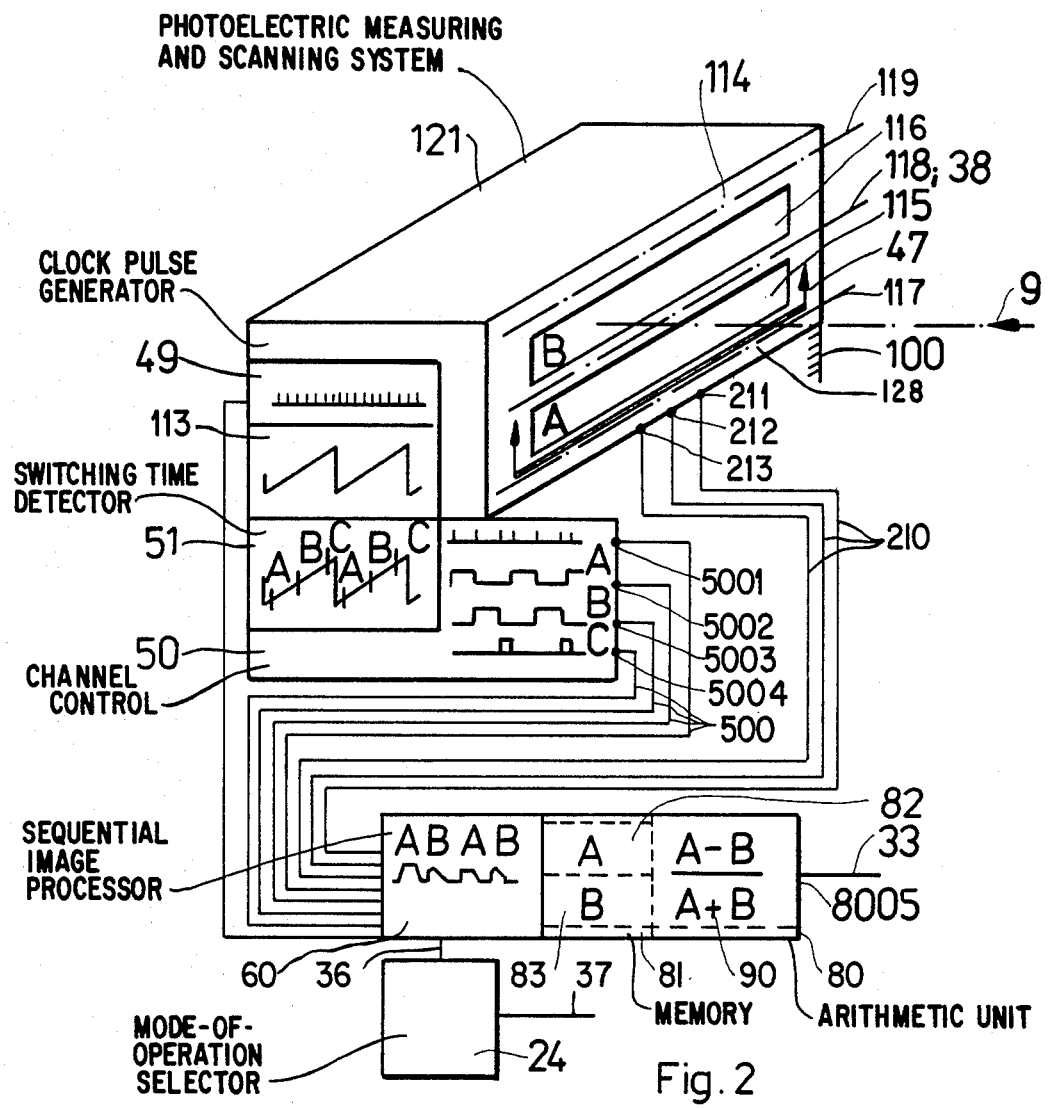
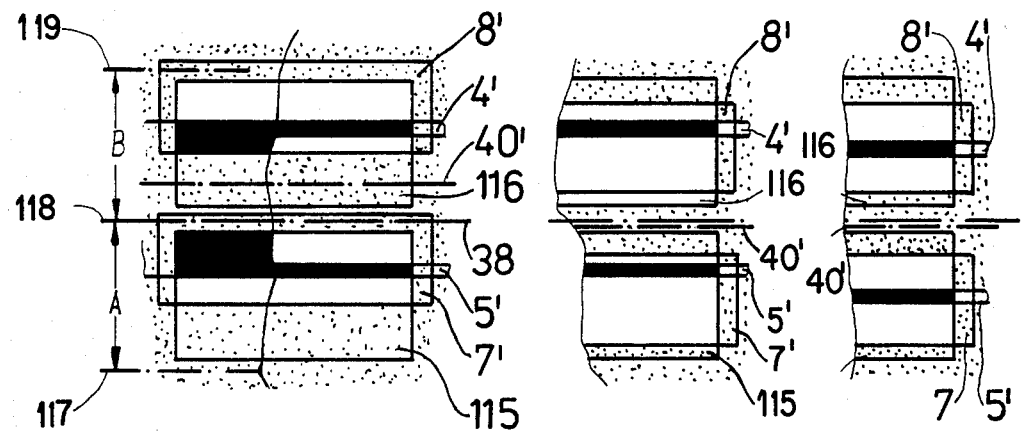
Fig. 3a  Fig. 3b  Fig. 3c

ARRANGEMENT FOR THE AUTOMATIC ADJUSTMENT OF AT LEAST ONE OBJECT

This invention relates to an arrangement for the automatic adjustment of at least one object, such as a semiconductor disc and a template facing a photo-electrical measuring and scanning system, or the adjustment of the two objects towards each other in step-wise projection lithography for the manufacture of semiconductive structures in planar technology.

The adjustment is made based on adjusting marks on both objects with at least one axis of symmetry. The adjusting marks are illuminated by a light source and reproduced by optical systems on the scanning plane of the photo-electrical measuring and scanning system. The video signal conveyed by this system is processed electronically, evaluated by an arithmetic unit and converted into control signals for at least one final control element that effects the adjustment.

This invention can also be used for other symmetry compensation systems with the help of marks, as, for instance, in dual-trace photometry, in which alignment stops may act in the same way as the marks.

Different arrangements are known for the automatic adjustment of two objects, for instance for special application in photolithography for the alignment of the semiconductor disc and the template towards each other. Herein the adjusting marks of the two objects are jointly reproduced on a photo-electrical measuring and scanning system, which processes the corresponding signals, for instance through a computer, and generates control signals for control motors which move one or both objects. Herein each of the two objects is successively adjusted in the measuring and scanning system.

Image scanning is processed by means of a television camera (DOS No. 25 23 858), oscillating mirror (DD No. 108 620) or a slotted carrier, such as a rotating slit or apertured partitions, where evaluation of the image signals is processed either by photometry (especially for surface marks) or by image analysis (especially for border marks).

At the present time different kinds of marks on semiconductor discs are used. Surface marks are those which appear in reflected light as dark surfaces on a bright background. Border markings are generally produced by etchings. They appear in the reflected light only on the slopes of the etchings as dark edges. The mutual interruption of the two light currents through a rotating chopper is known in dual trace photometry, wherein this chopper may have, for instance, light barriers for the switching or attribution of the signals obtained from the light currents for the individual beam path that is being scanned (Pocketbook Feingerätetechnik, vol. 1, section 14 "Optische Messtechnik", especially 14.2.2. "Photometrische Messverfahren", Verlag Technik Berlin 1968).

In the adjustment of the two objects in photolithography, analogous therewith, differently formed slotted carriers are used for image scanning, which also may have separate reference or control signals producing openings for channel switching, which are scanned through light barriers (DOS No. 21 60 282). Each of the known arrangements provides only for the application of one type of marking, it being thus adapted either to structure recognizance or to photometry. The known arrangements also do not allow the adjustment of two objects towards each other and of an object in relation to a measuring and scanning system by joint means.

It is the aim of this invention to provide a highly precise and at the same time rapidly adjustable means for adjustment of a semiconductor disc and a template towards each other with the selective use of different adjustment marks—either according to the thereby influenced light currents within the adjustment marking image or according to the position of their structure—with a high degree of avoidance of systematic errors. Herein actual conditions, such as light conditions with the therefrom resulting signal-noise behavior, are to be taken into account. It is purported to attain an increase in exactness of adjustment and productivity.

It is the aim of the present invention to provide an arrangement for obtaining symmetric compensation, wherein for the selected evaluation of an image according to light currents or structure a signal is produced for rule deviation, in order to activate a control loop that will produce a balanced image to a stationary axis.

The problem may be reduced to movement in only one direction of the engaging system, which usually includes two translational movements in the x and y directions as well as a rotary movement around angle which, however, are of equal importance for solving this task. This question arises especially when semiconductor discs are involved, which in the capacity of adjustment marks bear surface or border markings, which, as structure, have a symmetrical axis that is parallel to a stationary axis of the scanning plane of the photo-electrical measuring and scanning system of the arrangement for automatic adjustment in step-wise projection lithography. As regards these adjustment markings, to allow a universal application of these two types of markings, there should either be determined the place of the structure or the light currents influenced by the adjustment marks, using substantially the same means.

In general terms, such a semiconductor disc bearing the mentioned marks is the first prerequisite so that for similar tasks a corresponding object may be provided with such marks and adjusted.

In accordance with the invention, this object is solved by providing a first means which, in the scanning plane of a light-electrical measuring and scanning system, activates a first image segment and a second image segment separated by a stationary axis which, in essence, have the same formation and, in relation to the stationary and optical axis, are arranged opposite to each other and parallel to the symmetrical axis of the adjustment marks. A second means in the photo-electrical measuring and scanning system makes periodical image scanning vertically to the stationary axis possible, being connected to a clock generator for the time base. By a switching time point detector connected to the photo-electrical measuring and scanning system, a first, second and third switching time points are given, between which the two image segments are used alternatedly for originating video signals.

The switching time point detector is a component of a channel control arrangement.

The measuring and scanning system as also the channel control arrangement are connected on the output side with a sequential video signal processing arrangement, and the arithmetic unit contains at least one memory workable in two function groups and at least one arithmetic unit whose output allows giving a control signal to at least one final control element for the adjustment of at least one object. There is thus produced an image of the adjustment marks of an object with its balancing characteristics in the scanning plane of the photo-electrical measuring and scanning system by means of the optical reproducing system. As dictated by convenience, the scanning system may be a mechanical scanning arrangement, such as, for instance, the known rotating chopper disc or slotted disc with the respective hole or slit as a scanning element, or an electronic arrangement, such as a television camera tube, for instance of a Vidicon type with the electronic scanning beam as scanning element, or an image dissector tube with a diaphragm as scanning element or a CCD-structure with a receiving element as scanning element. To ensure that precision that can be achieved in the endeavored multiple use of the image, selected according to need, a two-beam process is created. The image is split in the scanning plane by the function of a mask as a first means with two windows, symmetrical to the stationary axis, for the origination of image segments.

These windows are equivalent or similar to the dimensions of the window limits according to given tolerance conditions so that real or functional mask windows originate which are conveniently separated by a center rod without image content.

Real mask windows are appropriate for a mechanical scanning arrangement. Functional mask windows are possible by an electronic masking out of the signal outside of the now existing electronic window restriction. By means of the center rod, independence from tolerances for the subsequently treated channel switching arrangement can be achieved.

To achieve the formation of a two-beam process by means of a channel-switching arrangement, each of the mask windows is attributed to one video signal, wherein the video signal flow may occur in parallel, or preferably in series (time-wise).

To prevent errors by the scanning device, in consideration of the tolerances, including the window tolerances, attribution of the control signals for switching time points of the channel switching arrangement to the mask windows is effected in a way such that these lie outside the possible positions of the window restrictions, and that a first and third switching time point, each symmetrical to the stationary axis and outside the outer window limits is fixed and that a second switching time point is identical with the stationary axis.

This originates—as in known two-beam photometer processes, however here also utilizing the structure—two time slots, e.g. one before and one after the stationary axis, but now in a way that, uncovered by the mask, the signal segments will always lie inside the switching segments of the channel switching, this preventing any signal portions from being transferred to the wrong channel.

Very conveniently, the means serving to produce the control signals of the channel switching arrangements, like, for instance, the light slits for the photosensor, are also mounted on the component with the mask windows, in order to prevent errors between the position of the light slits and that of the windows.

In order to obtain a signal for rule deviation in the activation of a control loop for a balancing adjustment of signal information from the signal segments, an arithmetic operation is performed by an arithmetic unit in order to establish the rule deviation susbstantially independently from the absolute signal level, after each individual scanning cycle, to prevent dependence from time resp. delays which occur in known solutions and, besides, to neutralize the tolerances of the scanning element, for instance of the slit of the rotating slotted disc which prevails for one individual cycle, and this in a manner that for all possibilities of utilization of the image from the video signal information of a first switching signal lying between a first and a second switching time point, there is obtained a value A which is divided by a value C, and that equally for a second switching segment between a second and a third switching time point, there is obtained a value B which is divided by a value D into a value for the rule deviation as the difference between the two quotients, multiplied by a device factor K, forming $X = K(A/C - B/D)$, wherein, above all, it is not relevant whether the arithmetic unit operates with analogous or digital values.

Moreover, this arithmetic operation is adapted to the mode of balancing compensation after utilization of the light currents as a comparison between two mask windows through an integration of the video signal, which here conveniently is proportional to the light current, by means of an integrator within the first switching segment for value A and within the second switching segment for value B.

Thus, in view of the action of the mask windows, actual integration up to the mostly negligible dark current of the photo-electric converter, despite the fact that the switching time points lie on the outside, is effective only within the mask windows.

In the frequently occurring event, for instance that upon compensation by means of surface marks values A and B flow opposite to each other, then the switching $C = D = A + B$ is provided.

In the event of pure photometry, when a mixed measuring beam path is used for compensation purposes, then only the comparative beam path is compensated. For this purpose, a switching $C = D = A$ or B is made wherein the value that remains constant in the balancing compensation is inserted.

For the desired overlapping system, this case, however, is without significance so that for deviations to the rule, in general, the formula $$X = K \frac{A - B}{A + B}$$

and, as the simplest solution, $X = K(A - B)$, will prevail.

The sequential image-processing arrangement prepares the incoming video signals in the sequence A-B-A-B for processing in the arithmetic unit. The standard value obtained from the arithmetic unit is the input value of the rule deviation for the first control and drive arrangement for the alignment of the first object.

Thus it is possible by using essentially the same means to utilize besides surface marks also the technologically advantageous border marks with a high degree of exactness and speed for a balancing compensation, either in photometric exploitation or yet in structure-sensitive evaluation.

While in the first described arrangement within the frame of the alignment system it is purported to create a balancing compensation for an object in relation to a measuring system, it is the task of the extended scope of the arrangement to accomplish the positioning of two linear objects only in relation to each other, largely independent of the position of these objects in relation to the measuring system.

The solution parts from the assumption that the second object assumes the function of the measuring system of the first process, as will be exemplified below.

Herein especially the first object is a semiconductive disc with surface or border marks. The second object is then a template having a structure that is usual in the manufacture of semiconductors, being provided with adjustment marks, and besides has the features of a template as a sample of light-impermeable and light-permeable surfaces.

A known second reproduction system is situated between the first and the second object, which is fitted for reflected-light illumination of the first object, and a beam splitter for splitting the beam into an illumination and a reproduction beam path which, in turn, includes the first reproduction system. Over the illumination beam path, the adjusting marks of the second object resp. the template are reproduced in the plane of the adjustment marks of the first object, and thus provide a picture of the position of the two adjustment markings towards each other according to the Abbeschen comparison principle.

This image of the adjustment marks of the second object and the adjustment marks of the first object are reproduced in the scanning plane of the light-electrical measuring system over the reproduction beam path, over the beam splitter and the first reproduction system. This already would make the reproduction workable, however only in reference to the measuring system.

In order to achieve as much as possible a separation from the measuring system and a strict execution of the two-beam process, a separation into two parts of the reproduction of the adjustment marks is processed in a similar way through the formation of template marks, each in the form of two windows, which are symmetrical to a mirror axis and, with some tolerance, parallel to a stationary axis, and thus to a pair of template windows with a center rod without image content, so that in a given tolerance field the pair of template windows will always lie inside the limits of a corresponding pair of mask windows.

Thus, through the application of shaded images, it is ensured that only a threshold value is necessary so that the comparison principle for the attainment of the achievable exactness can be employed on a continuous basis. Also, by the formation of template adjustment marks and the beam path, the function of the measuring system has been relocated to the second object so that alignment of the two objects with each other can be processed independently within the shortest possible time. The standard size obtained thereby is the standard input for the first activation and driving arrangement for alignment of the first object. The automatic alignment of two linear objects with each other, especially overlapping of the semi-conductor disc in relation to the template, pressuposes that the template be in the capture range for automatic overlapping and that to ensure favorable optical reproduction conditions it also be within a given tolerance range. This makes possible, by conveniently using as much as possible the same means based on structure recognizance of the adjustment marks, to provide for each case a new template to align with the measuring system.

A precondition for solving this task is that the template be alignable by a control driving arrangement similar to that used for the semiconductor disc, in conjunction with a switching arrangement for the signals for rule deviation.

Herein one parts from the assumption that the adjustment markings formation of the template in the form of a pair of windows sets a basis for their alignment vis-a-vis the pair of mask windows of the scanning arrangement.

The solution of this task is achieved by the split of the image into partial sums or partial distances, e.g. by the fact that for this purpose there are used as criteria for a balancing compensation in each case the outer partial distances uncovered by the template mark limits. Thus rule deviation is formed by means of a switching $$A = A_1;\ B = B_n,\ C = D = A_1 + A_2 + \ldots + A_m + B_1 + B_2 + \ldots B_n,$$

wherein a normal adjustment marking picture may overlap itself.

Then the signal for rule deviation is switched to the input of the second control and driving arrangement for the template so that this control loop will be closed.

In the event that the adjustment mark image for alignment of the semiconductor disc in relation to the pattern happens to be unfavorably located so as to influence the standard value for the case in process, then one may switch over to the operation mode for a balancing compensation according to structure, in order that the alignment of the semiconductor disc with the template and that of the template with the scanning device may be effected in an optimal way.

Figure 4:
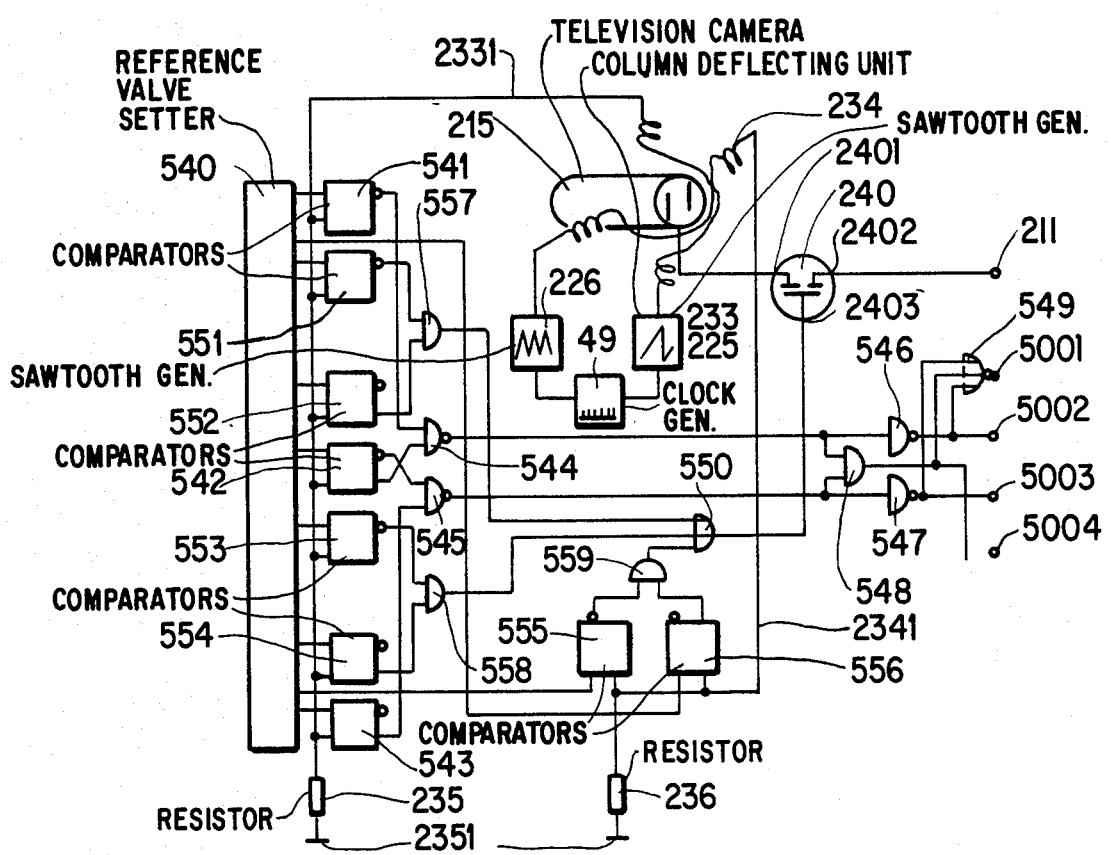
Figure 5:
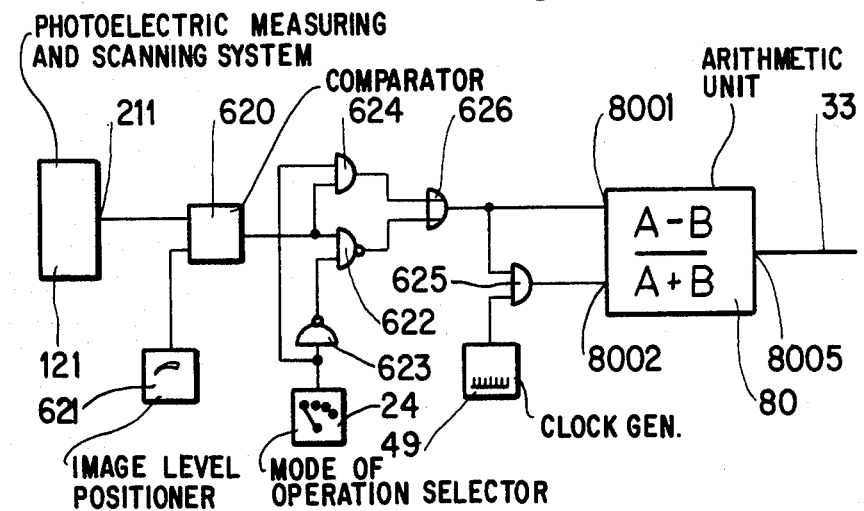
Figure 6:
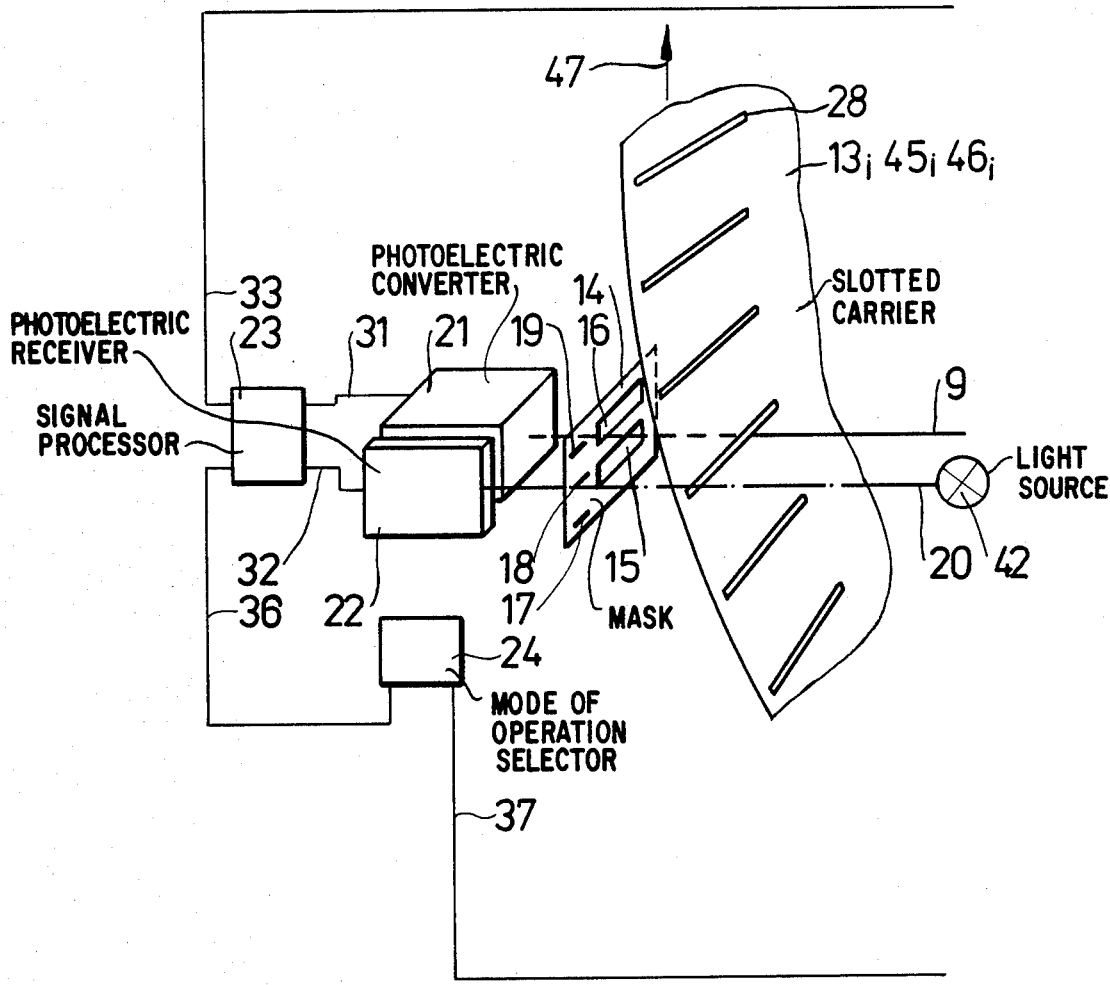
Figure 7:
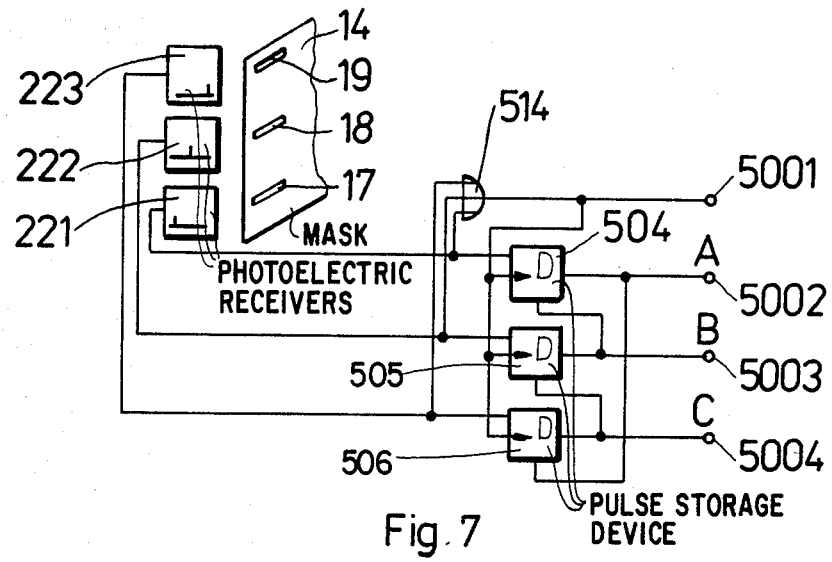
Figure 8:
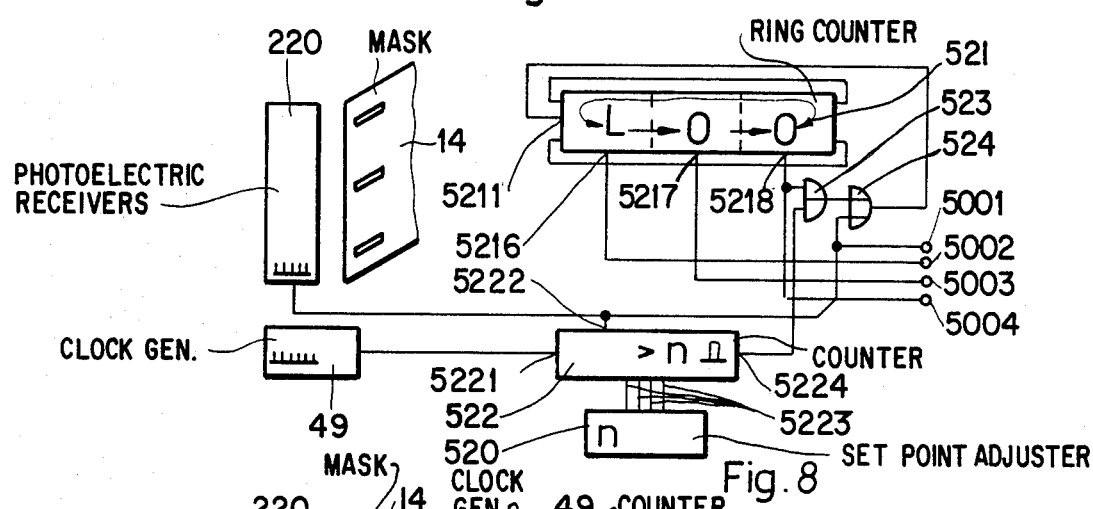
Figure 9:
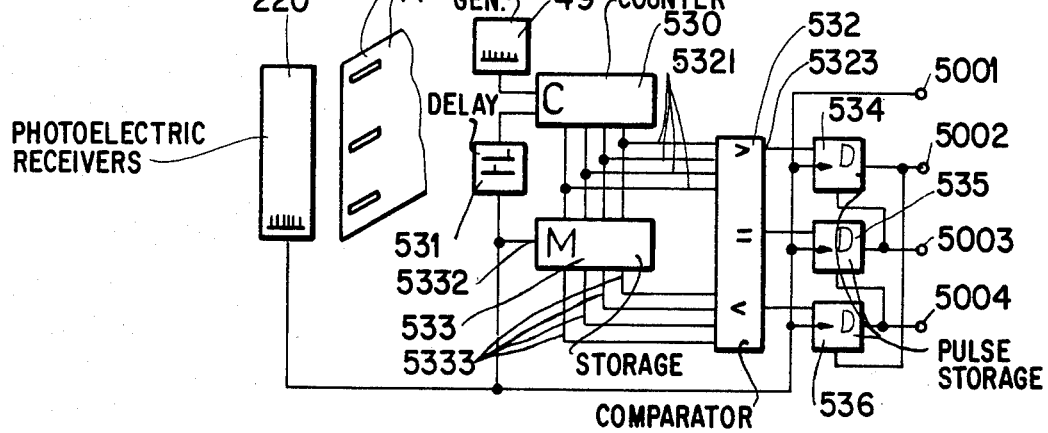

This invention is described below, making reference to the schematic drawings. These show:

FIG. 1: part of an example of one embodiment,

FIG. 2: the other part of the embodiment according to FIG. 1 for the attainment of signals of adjustment-marking images, FIGS. 3a, 3b and 3c: the pertinent adjustment marking images, FIG. 4: a second embodiment for the obtaining of signals with a television camera, FIG. 5: that part of the arrangement serving to the processing of video signals, FIG. 6: a third embodiment with a mechanical scanner of adjustment marking images, FIG. 7: that part of a third embodiment serving to the obtainment of control signals with three photo-electrical receivers, FIG. 8: that part of the third embodiment serving for the obtaining of control signals with a photo-electrical receiver, FIG. 9: a second embodiment for the obtaining of control signals according to FIG. 8.

In FIGS. 1 and 2 a semiconductor disc 1 (first object) has adjustment marks 4, 5 illustrated on an enlarged scale. A first objective lens 10, a semi-transparent mirror 11, a template 2 (second object) and a light source 43 are arranged along an optical axis 9. Template 2 has adjustment marks 7, 8 shown in an enlarged scale in the form of rectangular light-transparent areas (template windows) which are symmetrical to a template window axis 40.

A second objective lens 12 is located in the reproducing beam path for semiconductor disc 1.

A first final control element 26 and a second final control element 27 are coupled by means of mechanical connections 29, 30 to objects 1 and 2 for adjustment of the same. The final control elements 26, 27 are connected to a made of operation separating filter 25 over signal lines 34, 35, the drive switch, in turn, being connected over a signal line 33 with an output 8005 of an arithmetic unit 80 and over a signal line 37 with a mode-of-operation selection arrangement 24 (FIG. 2). In the reproduction beam path with the optical axis 9, there is situated, in the range of a scanning plane 100, a photo-electrical measuring and scanning system 121 with a first means 114 to produce a first image segment 115 and a second image segment 116. A dotted line characterizes a first switching time point 117, a second switching time point 118 and a third switching time point 119, between which the image segments 115 and 116 are used to originate video signals. A switching segment A lies between the first and the second switching time points 117, 118. A switching segment B lies between the second and the third switching time points 118, 119, and a switching segment C lies between the third and the first switching time points 119, 117.

Herein the first switching time point 118 coincides with a stationary axis 38.

A physically provided scanning element 128 or one obtained through electronic switchings has a running direction 47 and moves, successively, through switching time point 117, image segment 115, switching time point 118, image segment 116 and switching time point 119. The photo-electrical measuring and scanning system 121 has a second means 113 for periodical image scanning. A clock pulse generator 49 as well as a switching time point detector 51, which is a component of channel control arrangement 50, are connected internally to means 113. A sequential image processing arrangement 60 is in contact with arithmetic unit 80 or may also be a component of the same.

Arithmetic unit 80 comprises a memory 81 with a first function group 82 and a second function group 83 for values A and B as well as for the arithmetic arrangements 90. The sequential image processing arrangement 60, and thereby also arithmetic unit 80, are connected to the photo-electrical measuring and scanning system 121 over image signal lines 210; with the channel control arrangement 50 over operation control lines 500; and with the mode-of-operation selection arrangement 24 over a signal line 36.

FIGS. 3a, b, c comprise the images 4', 5' of the adjustment marks 4, 5 and of the template windows 7', 8' with the template windows axis 40' in the scanning plane 100 of the photo-electrical measuring and scanning system 121. In the left half of FIG. 3a, images 4', 5' of adjustment marks 4, 5 are formed as surface marks and, in the right half, as border marks.

The template windows 7, 8 illuminated by light source 43 are reproduced by the first objective 10 in the plane of the adjustment marks 4, 5 of the semi-conductor disc 1 and, jointly with these, over the first objective 10, the semi-transparent mirror 11 and the second objective 12, in scanning plane 100 of the photo-electrical measuring and scanning system 121.

FIG. 3a shows these reproductions for an uncompensated state of the semiconductor disc 1 as also the template 2, for instance, at the beginning of the compensating process. The images of the template windows 7', 8' here lie nonsymmetrically (in FIG. 3a shifted upwards) to stationary axis 38 so that they are partly outside image segments 115, 116.

Images 4', 5' of the adjustment marks of the semiconductor disc 1 also are nonsymmetrical to stationary axis 38.

Within image segments 115, 116, there thus result illuminated and nonilluminated ranges. Here the bright ranges will be those through which light from light source 9 flows freely through the template windows 7 and 8 after reflection of the semiconductor disc 1 over optical reproducing systems 10, 12 onto the image segments 115 and 116.

The dotted ranges are those in whose inside a shading through template windows 7, 8 occurs or where the light hits the scanning plane 100 outside the image segments 115, 116. Inside the dotted ranges, the contours of image segments 115 and 116, as well as the adjustment mark images 4', 5' of semiconductor 1 and the images of template windows 7', 8' have been drawn in a continuous form although they do not contribute to image-signalling formation.

At the scanning of the images drawn by scanning element 128, which is moved periodically through second means 113 in the manner of a sawtooth, no light will fall on the darkened ranges of any one of the photoelectrical converters mentioned in the next paragraphs.

In the bright ranges, the amplitude of the electrical video signals corresponds to the light current.

The form of signal corresponds to the selected kind of photo-electric measuring and scanning system 121, which may be formed as a television tube, for instance of the Vidicon type, or as an image-dissecting tube, or solid body arrangement, for instance as a CCD structure. In these cases the input quantity is an analog electrical current. The video signal is amplitude-modulated by the image structure and adjoins an output 211 of the photo-electric measuring and scanning system 121. It may also be present via an analog-digital converter in binary-coded form in an output 212 of the photo-electric measuring and scanning system 121.

A photo duplicator, which can be operated as a photon counter, is suitable for a mechanical scanning of the image. This is also possible with an image dissector. The video signal pertaining thereto is a pulse sequence which is proportional to the light current. The signal form thus lies in pulse modulation in an exit 213 of the photo-electric measuring and scanning system 121.

The modus operandi will be described with the help of temperature modulation. The video signal reaches, in sequence, for the switching segments A and B, the sequential image processing arrangement 60. To make separate processing of the video signals for switching segments A and B possible, control signals are diverted from the second means 113 through the switching time point detector 51. This, as will be described further on, may be done in different ways, depending on the abovementioned types of photo-electric measuring and scanning systems that are required to correspond to the converters available in each case. In channel control arrangement 50, there are produced control signals for a switching segment exit A 5002, for a switching segment exit B 5003 and for a switching segment exit C 5004, wherein, in these cases, a pulse is present for the duration of the condition. There are further available shot pulses in a switching time point exit 5001 corresponding to the switching time points 117, 118, 119.

In order that there may exist proportionality between the path described by the scanning element 128 and the moment of time for the corresponding video signal, the scanning element is operated synchronously with the clock generator 49 whose signal also serves for the measuring of streches in the image and the sequential video signal processing arrangement 60, thus also being led to arithmetic unit 80. The scanning element 128 in television tubes is the scanning electron beam, in solid-bodied receivers, the individual receiving element, while a light-permeable slit 28 of a slotted carrier 13, as represented in FIG. 6 serves for mechanical scanning.

When image evaluation is to be determined photometrically, only surface marks, as represented in FIG. 3a left, will be appropriate. It can be recognized that the light-permeable surfaces are in a non-compensated state, the light currents within switching segments A and B being thus uneven.

In arithmetic unit 80 in connection with the sequential video signal processing arrangement 60, video signalling sequence is separately integrated for the switching segments A and B, or counted on pulse modulation, or balances stored in binary-coded video signals. Then the results after each switching segment A are by way of example transferred to the first function group 82 of memory 81 and stored there and in like manner stored after each switching segment B in the second function group 83.

In switching segment C, where there is no video signal or one that is significant enough, calculation of the rule deviation is standardized in arithmetic unit 90, it being thus obtained largely independent of the absolute light quantity through difference formation of the results obtained with values A and B from switching segments A and B, with subsequent division by the total result from both switching segments. The signal is present at the switching-time point exit 8005 and triggers a displacement of final control elements 26, which moves the semiconductor disc 1 with the adjustment marks 4 and 5 (as surface marks), until the light current of both switching segments is equal. Already from FIG. 3a it can be recognized that with the use of the arrangements of this invention such compensation, despite a strong disadjustment of the template, is easily obtainable. The working pattern of arithmetic unit 80 depends largely on the computer used.

Similarly, it depends on which functions of the sequential image processing arrangement 60 are taken over by computer 80. Therefore, both units have been represented in FIG. 2 as a block.

Before entering into a description of the effects derived from the modus operandi for image analysis, FIGS. 4 and 5 will first be explained. FIG. 4 represents the photo-electric measuring and scanning system in connection with the use of a television camera 215. A column deflecting unit 233 is connected, on the one hand, with a column sawtooth generator 225 and, on the other hand, over a line 2331 with first inputs of comparators 541 to 543 and 551 to 554 as well as a resistance 235. A line-deflecting unit 234 is connected, on the one hand, with a line-sawtooth generator 226 and, on the other hand, over a line 2341 with the first inputs of comparators 555 and 556 and a resistance 236. The two resistances 235 and 236 are connected at their ends 2351 to the chassis ground. The two sawtooth generators 225 and 226 are each connected to the clock generator 49. The other inputs of comparators 541 to 543 and 551 to 556 are connected to a multiple reference values setter 540. The negated output of comparator 541 is connected to an input of a NAND member 544, while the non-negated output of comparator 542 is connected to the other input of a NAND member 544. The negated output of a comparator 542 is connected to an input of NAND member 545, and the non-negated output of comparator 543 to another input of the NAND member 545. The output of NAND member 544 is connected not only to the input of NAND member 546, but to the input of an AND member 548 as well. The output of NAND member 545 is connected not only to the input of a NAND member 547, but also to another input of AND member 548.

The output of NAND member 546 is connected to a first input of an OR member 549 as also to the switching segment exit A 5002 of channel-control arrangement 50. The output of NAND member 547 is connected to a second input of OR member 549 as also to the switching segment output B 5003. The output of AND member 548 is connected to a third input of the OR member 549 as also to the switching segment output C 5004. The output of OR member 549 is connected to the switching time point output 5001.

The negated output of comparator 551 is connected to the input of an AND member 557, while the non-negated output of comparator 552 is connected to another input of AND member 557. The negated output of comparator 553 is connected to an input of an AND member 558 and the non-negated output of comparator 554 with the other input of AND member 558. The negated output of comparator 555 is connected to an input of AND member 559.

From an OR member 550, a first input is connected to an output of AND member 557, a second input with the output of AND member 558, a third input with the output of AND member 559 and the output with the inhibit input 2403 of an analog signal gate switching 240. From the analog signal gate switching 240, a signal channel input 2401 is connected to a video signal output of a television camera 215 and a signalling channel output 2402 with the output 211 for analog video signals of the photo-electric measuring and scanning system 121.

The function of the arrangement represented in FIG. 4 is the realization of a first means 114 and of a second means 113 for the event that a television camera 215 may serve as a photo-electric measuring and scanning system 121. Here there is especially provided in the television camera a camera tube by which scanning of the image is processed in a photosensitive cathode through focussed electrons in a vacuum.

The first means 114 is an analog signal gate switching 240, here represented as a field effect transistor, whose channel lies in the video signal line, which either allows the analog video signal to pass or inhibits it.

The technical possibilities of execution of such an analog signal gate switching are multiple and correspond to the solutions for electronic choppers in chopper reinforcers.

To the generation of a first 115 and a second 116 image segments, which are separated by stationary axis 38, serve the binary gate switchings in combination with range comparators which will still be described. Such range comparators work in combination with the multiple comparative value setter 540. The latter has as many voltage extensions as there are switching time points 117, 118, 119 and upper and lower, right and left image limits of image segments 116 and 117. The conditions of the electrical voltages of the voltage connections on the multiple comparative value setter 540 correspond to the geometrical conditions of switching time points 117, 118 and 119 as well as to that of image segments 115 and 116 themselves and in relation to each other as well as to a necessary video signal-free range between image segments 115 and 116.

These electrical voltages of the voltage connections of multiple comparative value setter 540 are comparable to a continuous electrical voltage, which corresponds to the momentary position of the scanning element 128, which in television camera 215 is the momentary place of a focussed electron beam. In camera tubes, for instance of the Vidicon type, which may conveniently also be inserted in a television camera 215 with interposed image reinforcer, the scanning element 128 is the scanning electron beam that incides on a photosensitive cathode and, in similarly formed (for instance, also with image reinforcer) camera tubes of a dissector type, the scanning element 128 is a diaphragm, through which part of an electron image reproduced on the diaphragm, which is there reproduced by the photosensitive cathode, reaches a photoelectron multiplier.

The momentary position of scanning element 128 is given by momentary currents which flow through the coils of the column deflection unit 233 and the linear deflection 234, which are produced by a column sawtooth generator 225 and a line sawtooth generator 226.

The current electrical voltage, which corresponds to the momentary position of scanning element 128 in the embodiment according to FIG. 4 is captured over resistances 235 and 236, which are traversed by the momentary currents of the column deflection unit 233 and linear deflection 234.

This is the most simple solution for current-dependent voltage generation.

Other switchings are possible to correspond to the function in mind for the generation of current-dependent quantities, for instance, by voltage-transforming operational amplifiers. Herein the multiple comparison value setter 540 may also comprise voltage generators instead of voltage capturers. A current-proportional comparison for the momentary position of scanning element 128 is preferred to keep at a minimum any errors that may arise for the switching time points 117, 118 and 119, which, in turn, may originate errors in the adjustment procedure of the first and second object 1 and 2. For similar reasons, there is also preferred the magnetic electron-beam deflection of the camera tube to an electrostatic deviation.

The above-mentioned range comparators are built up with the aid of two comparators in each case, for instance 555 and 556, of which, in each case, one negated output of comparator 555 is coupled to the non-negated output of the, in each case, other comparator 556-AND, here with the AND member 559. Such comparators, which from a comparison of two analog voltages between their inputs form a binary output signal, mostly have not, as in this invention, a negated and a nonnegated output.

When only one output is needed, a corresponding polarization of the inputs determines whether the binary output signal is negated or non-negated. Both outputs in a comparator may, when they are nonexistant, be realized by negation with the aid of an additional NAND member.

Individually, comparators 551 and 552, in combination with AND member 557, form the range comparator for the height of image segment 115, wherein at the output of the AND member 557 there will prevail a "high" state for as long as the voltage on the jointly connected inputs of comparators 551 and 552 moves between the heights of the corresponding voltages at their other inputs.

Further, the output signals of AND member 558 will always correspond to the height of image segment 116, of AND member 559, to the width of image segments 115 and 116, of NAND member 544, to switching segment A, and of NAND member 545, to switching segment B.

The output signals of the range comparators are logically further processed by the following method: for the up to now missing switching segment C, the signal for the switching segment exit C 5004 is formed by means of AND member 548 from the logic (Boolean) expression "not switching segment A and not switching segment B."

The signals for switching segment exit A 5002 and the switching segment output B 5003, in view of the existing logical expression, must first be negated as well as the signals be again negated by means of NAND members 546 and 547. The short-timed pulses for the switching time point output 5001 are here formed for instance from the switching gaps of the signals between the switching segments A, B and C with the aid of the OR member 549. Technical realization may also be accomplished, depending on pulse conditions, through differentiation of the segment switching signals A, B and C.

The signals for the image segments 115 and 116 are fed into the switching segments A and B through OR coupling of the output signals of the AND members 557 and 558 on the first two inputs of the OR member 550 represented in a simplified manner, whose output signals release the analog signal gate switch 240 within image segments 115 and 116, inhibiting it to the outside. If the image width of the line scanning by the linear deflection unit 234 is larger than the width of image segments 116 and 117, then the image width is additionally coupled to the third input of OR member 550 through the output signal of AND member 559. It will be advantageous to provide an execution where the outputs of the AND members 557 and 558 are coupled to two inputs of an OR member, and the output of the latter to the first input of a further AND member, and the output of AND member 559 to the second input of a further AND member, while also all the other logical couplings have technically been executed in a different way, according to convenience.

Consequently, the analog image signal of television camera 215 masked by the image segments 115 and 116 occurs at the output of the photoelectric measuring and scanning system 211, its amplitude depending on image brightness at the spot of the scanning electron beam.

Such location for the electron beam is determined in a known way by the current which flows through the column and line deflection units 233 and 234, being produced in the column and line sawtooth generators 225 and 226 which, in turn, are synchronously controlled by clock generator 49.

FIG. 5 represents the most important means of sequential video signal processing arrangement 60 for the modus operandi of image analysis for structure recognition, firstly, for individual adjustment marks and determination of their location.

Output 211 for analog video signals of the photoelectric measuring and scanning system 121 is connected to a first input of a video signal comparator 620 whose second input is connected to an image-level positioner 621. The output of video signal comparator 620 is connected to an input of an AND member serving as negator 622 as also to the input of an AND member serving as gate 624. The modus operandi selection arrangement is connected over a NAND member serving as switch 623 to a second input of negator 622 and also directly to a second input of gate 624. The output of gate 624 is connected to the input of an OR member 626, while the output of negator 622 is connected to a second input of OR member 626. The output of OR member 626 is connected directly to a first arithematic unit input 8001 for the binary video signal of arithmetic unit 80 as, also, over the input of an AND member serving as clock comparator, to a second arithmetic unit input 8002 for the video signal pulse. The clock generator 49 is connected to a second input of the clock comparator 625.

To provide an explanation of the two ways of modus operandi of the arrangement represented in FIG. 5, in connection with FIGS. 1 and 4, we will part from the technological steps taken at the manufacture of the epitactical semiconductor structures which in photolitography and, especially, in step-wise projection lithography, on the one hand, condition the adjustment of the different templates 2 necessary for one sole semiconductor disc to the subsequent successive structures and, on the other hand, make adjustment of the semiconductor disc 1 to template 2 necessary.

In the first case template 2, which bears the pertinent structure as well as the corresponding adjustment marks, here formed as template windows 7 and 8, is transported automatically or by hand by a magazine in such a way into the beam path with optical axis 9 that, as shown in FIG. 3a, the template windows 7 and 8 are in the capturing range of the photoelectric measuring and scanning system 121.

Further automatic readjustment can conveniently be processed by the same arrangement of the present invention, which can also be used later on to effect the adjustment of the semiconductor disc 1 in face of template 2 for the illumination of a photoresist on semiconductor disc 1. For the first case of the adjustment of the template 2 resp. its template windows 7 and 8 in face of the image segments 115 and 116, the modus operandi selection arrangement 24 is switched on automatically or by hand, which activates the arrangement according to FIG. 5 in order to process adjustment through image evaluation based on image analysis, thus through recognition and determination of position of the adjustment marks structure, contrary to the above described photometric image evaluation. Secondly, for this first case of adjustment, the exit of the modus operandi selection arrangement 24 may be, for instance, in a "low" condition of its signal. Thereby, with the aid of the NAND member serving as changeover switch 623, the NAND member which serves as negator 622 is released, while the AND member which serves as gate 624 is locked.

In this example, the television camera 215 according to FIG. 4 is selected as photoelectric measuring and scanning arrangement 24. The image-level setter 621 here is set in such a way that for the bright image portions shown in FIG. 3a at the right of the fault line and in FIGS. 3b and 3c the amplitude-modulated video signal from exit 211 of image comparator 620 is binarily processed in such a way that at its output there will originate, for instance, a "high" signal, while a "low" signal will originate at a dark image portion, as it is present in one of the images of adjustment marks 4' and 5' or through shading by template windows 7 and 8. This signal at the output of an image comparator 620 is a binary video signal which in the present switching of the modus operandi selection arrangement 24 is negated through a negator 622 and arrives over OR member 626 at the first input 8001 of the arithmetic unit for the binary video signal. For the "high" state of the binary video signal behind the OR member 626, the binary video signal given by the computer is modulated together with the clock pulses of clock generator 49 through clock generator 49 by means of the AND member serving as pulse comparator 625 so that for the duration of the "high" state of the binary video signal given by the computer a corresponding sequence of pulses will form at the second computer input 8002.

The further processing in arithmetic unit 80 is accomplished with the aid of specialized software so that, depending on the conditions set by the assemblage of the clock generator 49 and its connections which determine the path of the scanning element 128 to the timewise pulse spacing, there is first processed a determination of the path through a counting of the pulses for the duration of the "high" states of the binary video signals given by the computer, which form at input 8002.

Further, the counting of the "high" states or also of the "low" states of the video signals given by the computer, which form at the first input 8001 of the arithmetic unit, in attribution to the signals for the switching segments A, B and C, establishes the position of the image segments towards each other and towards the image segments 115 and 116, separated in this invention.

In order that the endeavored adjustment of template 2 to the photoelectric measuring and scanning system 121, here in the example to television camera 215, may be carried out—in a further development of the idea of the present invention with respect to separated image segments 115 and 116—as a further first means 114 thereto, the adjustment marks of the template as already cited template windows 7 and 8 are formed in such a way that, as shown in FIGS. 3a to 3c, their images 7' and 8' in the scanning plane 100 in the direction of stationary axis 38 have a larger dimension than the image segments 115 and 116, in order that positioning errors in this direction may have no adverse influence and the images of template windows 7' and 8' at right angles to the stationary axis be smaller than the dimension of the image segments 115 and 116.

If in addition the scanning of the electron beam of the camera tube of television camera 215 is considered, wherein only the column direction will be considered important as a scanning direction 47, as the structures by virtue of the parallelism of the stationary axis 38 to the pair of template windows 40 will only change significantly in that direction, then the following operation can be detected:

At the start of a periodical image scanning, the electron beam is outside the switching-time point 117 and in switching segment C. The analog signalling gate switching 240, therefore, is still locked so that at the video signal comparator 620 practically will be at a zero potential, giving, thus, a "low" signal, while conditioning by the signal path over negator 622 will result in a "high" signal at the first input of arithmetic unit 8001.

This binary video signal given by the computer, as also the video signal pulse present at the input of the second arithmetic unit 8002 are not yet processed in arithmetic unit 80 since the scanner is still in switching segment C. At the attainment of switching time point 117, and thereby of switching segment A, the pulses of the video signal clock present at input 8002 of the arithmetic unit are counted.

After passing switching time point 117, switching segment A is started and, at the onset of image segment 115, analog signal gate switching 240 is released. In the scanning plane 100, there follows in FIG. 3a in the scanning direction 47 (FIG. 2) a dark image portion, and for this reason, with the present switching form of the modus operandi selection arrangement 24, there will continue to be present a "high" signal at the first input 8001 (FIG. 5) of arithmetic unit 80, while at the second input 8002 of the arithmetic unit the pulse sequence of the video signal clock pulse will form. This pulse sequence is first counted into a first sub-storage of the first function group 82 of storage 81 until transition to the first bright image portion. Herein the binary video signal will rise from the "low" to the "high" state, while the binary video signal given by the computer at the first input 8001 of the arithmetic unit will pass from a "high" to a "low" state, the pulse sequence of the video signal clock being inhibited for the second input 8002 of the arithmetic unit. By the use of an arrangement which has not been shown here, the pulse signal of clock generator 49 also be further processed in the arithmetic unit during the "low" state at the first input 8001 of the arithmetic unit 80 for distance determination. During the next dark picture portion, here the image of the adjustment mark 5' of semiconductor 1, the pulse sequence of the video signal clock can be counted into a second sub-storage of the first function group 82 of storage 81, and according to FIG. 3a right of the trace line with a border mark for the second following dark image portion into a third sub-storage of the first function group 82 and with multiple border marks yet into a fourth etc. sub-storage of this function group 82 until the upper edge of image segment 116 and then the switching time point 118, whereby the end of switching segment A is reached.

For switching segment A, which starts with the switching time point 118, there occurs the storing of the pulse sequences of the video signal clock in a manner similar to that for switching segment A, with the difference that a first, second etc. sub-storage of the second function group 83 of storage 81 is occupied.

In the switching segment C, which starts with the exceeding of the switching time 119, there is formed by means of arithmetic unit 90 a value A, which corresponds to the content of the first sub-storage of the first function group 82, as well as to value B, which corresponds to the content of the lastly filled sub-storage of the function group 83 at a value $(A-B)/(A+B)$, as control signal for rule deviation.

This control signal for rule deviation is present at output 8005 of arithmetic unit 80 and, further, over signal connection 33, at the switch 25 for the mode of operation. This switch 25 for mode of operation in the presently dealt with case is controlled by the mode-of-operation selection arrangement 24 over signal connection 37 in such a way that signal connection 33 is connected to signal connection 35 so that the control signal for rule deviation finally occurs at the second final control element 27, whereby the template is displaced by an amount such that, with the least number of scanning cycles, in a borderline case only one scanning cycle of television camera 215, values A and B are sufficiently equal. Differently considered, compensation occurs up to equalization of the distance from the outer switching points 117 or 119 up to the individual outer template window edges from 7' or 8' respectively the image segment border from 115 or 116.

In FIG. 3b the compensated state is represented with an admissible residual error, a difference between the stationary axis 38 and the reproduction of axis 40' of the pair of template windows.

It can be recognized that thus in a simple manner, not only in the presence of surface marks but also with border marks in the image to be scanned, through the advantageous formation of the template windows 7 and 8 as a pair of template windows with the above mentioned geometrical conditions and through a simple switching in the sequential video signal processing arrangement 60 and of the arithmetic unit 80, the adjustment of template 2 is made possible.

It is to be noted that, in principle, it is also possible to provide a compensation for template 2 from the center switching point 118 up to the internal template window edges of 7' and 8', but in the interest of a stable rule behavior for surface marks it will be advantageous to assemble them lying in the inside, as represented in FIG. 3a left. Then, as described, only the distances to the outer switching points 117, 119 will be at disposal.

The next adjustment procedure in the technological process of the herein preferably considered step-wise projection lithography is the compensation of semiconductor disc 1 in relation to template 2 by means of adjustment marks 4, 5 as well as template windows 7 and 8, wherein the adjustment marks 4, 5 are formed as border marks. FIG. 3b represents the initial state in this adjustment procedure. Herein template 2 with the described residual error is adjusted with sufficient exactness, while semiconductor disc 1 was transported under control into the position as seen in the pictures of adjustment marks 4' and 5'.

The mode-of-operation selection arrangement 24 (FIGS. 2, 5) is set on an image analysis, thus on structure recognition and position determination and on an adjustment of the semiconductor disc 1 vis-a-vis the template 2.

Herein, to begin with, the mode-of-operation separating filter 25 (FIG. 1) is steered in such a way that the signal lines 33 and 34 are connected and the switching according to FIG. 5 is activated. Here in FIG. 5 there is present a "high" signal at the entry of switcher 623, whereby negator 622 is locked and gate 624 opened. The binary video signal given by the computer at the first entry 8001 of arithmetic unit 80 in this mode of operation is practically identical to the binary video signal at the output of video signal comparator 620. As a result, there arises at the entry of arithmetic unit 8002 a pulse sequence of the video signal clock, while the scanning element 128, here the electron beam of television camera 215, scans a bright image portion. In this way, on periodic scanning, first the analog signal gate switching 240 is locked in switching segment C up to the outer border of image segment 115. After exceeding the outer borders of image segment 115, the binary video signal still remains in the "low" state, since a dark image portion by reason of the light-impermeable border of the images of template windows 7' and 8' is present. A bright image portion follows from the outer border of the image of the adjusting mark 5' as border mark. There thus is present a "high" state of the binary video signal at the first entry 8001 of the arithmetic unit and a pulse sequence at the second entry 8002 of the arithmetic unit, in the arithmetic unit 80 this pulse sequence being counted and stored in the first sub-storage of the first function group 82 (conditioned by the control signal for switching segment A of switching segment output 5002 of channel control arrangement 50). The next sequence of pulses of the video signal clock, which originates during the scanning of the bright image portion between the inner border of the image of adjusting mark 5' and the inner border of the image of the template window 7', is, for example, stored in the second sub-storage of the first function group 82.

There then again follows a dark image portion, triggered by the inner light-impermeable range between the images of template windows 7' and 8'. Inside the rod between the two image segments 115 and 116, the analog signal gate switching 240 will be again locked against any video signal by reason of the already described logical operations. There follows a further dark image portion in switching segment B, until the inner border of the image of template window 8' is attained.

The next pulse sequence of the video signal pulse is, by way of example, stored in the first sub-storage of the second function group 83, activated by the signal for switching segment B of output 5003 of the switching segment of the channel control arrangement 50, during the scanning time between the inner edge of the picture of the template window 8' and the inner edge of the image of adjusting mark 4'.

The next pulse sequence between the outer edge of the picture of adjusting mark 4' and the outer edge of the image of the template window 8' then, by way of example, reaches the second sub-storage of the second function group 83.

Arithmetic unit 90 or, if necessary, still other units, depending on specialized selection, form either from the firstly stored value A derived from the first function group 82 and the lastly stored value B derived from the second function group 83 the value for rule deviation to $(A-B)/(A+B)$ or also from the lastly stored value A derived from the first function group 82 and the lastly stored value B derived from the second function group 83, as preceding, the value for rule deviation or, in an especially advantageous manner for the compensation of errors, the average value for the two aforedescribed values for the should-be value of the control signal for the first final control element 26 in order to displace the position of the semiconductor disc until values A and B are equal, as represented in FIG. 3c.

There clearly results that with the means of this invention an exact adjustment of semiconductor 1 vis-a-vis template 2 can be provided although the template has been only approximately adjusted in relation to the stationary axis 38 of the photoelectric measuring and scanning system 121.

The aforedescribed adjustment can be processed also with surface marks and multiple edge marks, which can easily be carried out later.

In the here preferably considered step-wise projection lithography, the speed of the aforedescribed adjusting process is influenced in a decisive manner by the work output of the equipment needed in this connection. Such adjustment speed requires control loops with high self-resonance in conjunction with high scanning frequencies for the scanning element 128. Under existing, often unfavorable monochromatic light conditions for the photoelectric measuring and scanning system 121, sometimes allied to a bad contrasting of the adjustment marks 4 and 5 opposite their immediate environment and the high relative speed of the adjustment marks 4 and 5 in reference to the scanning frequency for the scanning element 128, has different types of measuring and scanning systems 121, as they have already been mentioned before, compete among themselves with different advantages and disadvantages.

The television camera 215 considered before in the example of embodiment has with the provision of a camera tube of the Vidicon type, on the one hand, the advantage of a relatively good signal-noise relationship in regard to the elementary photon noise because of the storing effect of the photo cathode and, on the other hand, the disadvantage of a deterioration in contrast when quickly moving images are involved, which, as described, may be the case.

For this reason, by way of example, there will also be described a mechanical scanning by means of a slotted carrier 13 with the optically effective individual slits 28 in connection with FIG. 6, in which a photoelectric converter 21 depends directly, in a disadvantageous way, from the signal-noise relationship of the photon noise, not being capable to improve the situation since only momentary values of light for the video signal can be processed. One disadvantage here, however, as also in an image dissector serving as camera tube in the above described embodiment, is that in quickly moving pictures no loss of contrast will occur.

It is thus up to the technician to select the type of photoelectric measuring and scanning system 121 which should be preferred under certain conditions. FIG. 6 as well as FIG. 2, to be supplemented with FIG. 1, show the aforementioned additional possibility of image scanning by mechanical means. A slotted carrier 13, which is activated in the longitudinal direction 47 by a not here represented drive motor 45 with an also not represented driving arrangement 46, has slots 28, which are arranged in the reproduction beam path with the optical axis 9. There is further provided in the reproduction beam path a mask 14 with a first image breakthrough 15 and a second image breakthrough 16 and a photoelectric converter 21. Longitudinally to a second optical axis 20, which flows through the outer range of slots 28, there are arranged a light source 42, three slit-type breakthroughs 17, 18, 19 provided in mask 14 and at least one photoelectric receiver 22. A signal processing arrangement 23 is connected over signal lines 31, 32 to the photoelectric converter 21 and receiver 22, forming together with these a simplified and encompassing version for the elements of FIG. 2. The signal processing arrangement 23 is connected to the mode-of-operation selection arrangement 24 over a signal line 36. The connection to the operation mode "soft switch" 25 represented in FIG. 1 is processed over signal lines 33 and 37.

The mode of operation is very similar to the mode of operation using a television camera 215. The photoelectric converter 21 is, preferably, a photoelectron multiplier, which works in the photon counter device in connection with a corresponding discriminator reinforcer in order that the only unavoidable source of noise and disturbing influence will be the light of beam path 9. The light-impermeable mask 14 with its first and second image breakthroughs 15 and 16 serves as a means to realize the first and second image segments 115 and 116. These, taking into account the finishing tolerances, are of equal construction. They are provided to the stationary axis 38 and also to the optical axis 9, opposite each other, it being advantageous to provide a light-impermeable center rod in order to ensure, for the planned realization of a two-beamed process, a possibly tolerance-dependent, clean separation of the video signals for the image segments 115 and 116. To prevent contrast losses on image scanning through one of slits 28, the latter as well as the stationary axis 38 for the image breakthroughs 15 and 16 are formed possibly exactly parallel to the symmetrical axis 39 and also 40 of the adjustment marks 4, 5 and 7, 8.

In the generally uniform movement of the slotted carrier 13, depending on the momentary position of the individual slit 28 that happens to be running close past mask 14, as seen in FIGS. 3a to 3c, light in varying quantities falls onto photoelectric converter 21, wherein with the growing slit width, on the one hand, the signal-noise ratio for the image signal is improved but, on the other hand, the solubility of the image and the contrast are worsened.

The video signal itself with the advantageous photon counting method is a more or less compact sequence of pulses. For origination of the video signal in the signal processing arrangement 23, there serves an arrangement not here further represented, which being controlled by the clock generator in fixed times or path intervals, that are to correspond to the desired solubility for the image analysis as regards structure recognition, on the one hand, and determination of position, on the other hand, counts the pulses which part from the photoelectrons of the light-electrical converter 21. These photoelectron pulses, depending on time interval, thus correspond to the local brightness of the image scanned. After each time interval, the number of photoelectric pulses is compared with a predetermined number, which corresponds to a threshold value of brightness or to the light current corresponding to such brightness. This comparison releases a binary video signal under consideration of time or path interval, which will be designated as clocked binary video signal. Advantageously, there is also formed a negated clocked binary video signal, which delivers pulses in the event that the threshold of brightness is not surpassed, while the clocked binary video signal delivers pulses when the threshold of brightness has been surpassed. For a flip-flop output, either the state of the clocked or of the negated clocked binary video signal is seized until the respective state changes. A signal thus arises at the exit of the flip-flop output which corresponds to the binary video signal at the exit of the video signal comparator 620 so that the technical arrangement according to FIG. 5 may be changed according to the purpose in mind. For adaptation to the signal-noise relationship, the scanning speed of slit carrier 13 may be varied. By the fact that in the described arrangements advantageously, after each scanning cycle—the running by of a slit 28 at the two picture breakthroughs 15 and 16—a standard value is ascertained for each rule deviation, this arrangement with the movable slotted carrier 13 is by a far degree independent from the tolerances of the individual slits 28.

FIGS. 7, 8 and 9 illustrate, in connection with the lastly described arrangement with mechanical scanning through slotted carrier 13, several arrangements of switching-time detectors 51 as per FIG. 2 for obtaining control signals for the channel control arrangement 50. These arrangements, as well as the arrangement represented in FIG. 4 for the channel control arrangement, represent the possible, basic solutions which also can be employed for here not expressly discussed variants of photoelectric measuring and scanning systems 121, like such with solid-bodied receivers, for instance CCD-lines. But few mistakes arise with the utilization of this method of obtaining control signals for the channel control arrangement since the switching time points 117, 118 and 119 lie outside the image segments 115 and 116; however, with photometric image exploitation, a residual error because of light scattering and other side effects may occur. For this reason, it should be endeavored to provide for an attribution as exact as possible of the control signals for the switching time points 117, 118 and 119 in reference to image segments 115 and 116.

Such exact attribution is executed in FIG. 4 through the described coupling of the deflecting currents for television camera 215 to the jointly connected comparator entries for the switching time points 117, 118 and 119 as well as the entries for the image segments 115 and 116. For a mechanical image scanning according to FIG. 5, exact attribution is advantageously achieved by providing mask 14 with a first and second image breakthrough 15 and 16 as also with a first, second and third breakthrough 16, 17 and 18, which after manufacture of mask 14 are practically unchangeable towards each other. The photoelectric receiver 22, according to the execution shown in FIG. 7, may consist of a first, second and third photoelectric receiver 221, 222 and 223, wherein these are each attributed to the first, second and third breakthrough 16, 17 and 18, and in combination with slit 28 and a light source 42, form each a photosensor assembly with an optical axis 20. The therein necessarily provided optical reproduction systems are immaterial in this case and have, therefore, not been represented. In the examples according to FIGS. 8 and 9, by contrast, there has been provided for all three breakthroughs 17, 18 and 19 only one joint photoelectric receiver 220, wherein the arrangement according to FIG. 7, although it may provide for the easiest electronic processing, will, however, present difficulties in realization, if the distances between the three breakthroughs 17, 18 and 19 are so close that the arrangement of three photoelectric receivers 221, 222 and 223 may present problems or be impossible to realize. Besides, the real switching time point 117, 118 and 119 is not identical with the spatial arrangement of photoelectric receiver 221, 222 and 223 because of different optoelectrical qualities, such as sensitivity, for instance "squinting" of the optical spatial sensitivity distribution, for which reason an arrangement with only one joint photoelectric receiver 220 may be of advantage. In the example according to FIG. 7, the first, second and third photoelectric receivers 221, 222 and 223—which need to be in a position to deliver a logically processable exiting signal in that, if necessary, they are provided with a level-adaptor reinforcer, which is not represented in detail—are connected on the exiting side with each of the entries of an OR member 514 whose output is connected with the switching time output 5001 as also with the take-over entries, connected among themselves, of a first, second and third pulse storage 504, 505 and 506.

The pulse storages may be ordinary D-flip-flops, wherein the take-over entry is the "pulse" or "clock" entry.

The output of the first photoelectric receiver 221 is, besides, connected to the data input of the first pulse storage 504 (in D-flip-flops this is the D-input), similarly the second photoelectric receiver 222 to the data input of the second pulse storage 505 and, besides, the third photoelectric receiver 223 to the data input of the third pulse storage 506. The output of the first pulse storage 504 is connected to the switching segment exit A 5002 as also to the erasing input of the third pulse storage 506 and, in a similar manner, the output of the second pulse storage 505 with the switching segment output B 5003 and the reset input of the first pulse storage 504 as well as the output of the third pulse storage 506 to the switching segment output C 5004 and the reset input of the second pulse storage 505.

The effect derives from the fact that the pulse storages 504, 505 and 506 are constructed as a self-managing and parallelly activated ring counter, in which a logical "1" circulates, for instance always that output of a pulse storage 504, 505 and 506 will present a "high" state which has been prepared by a pulse of the three photoelectric receivers 221, 222 and 223 over the D-entry and been set through the pulse of the output of an OR member 514. At the switching time point output 5001, there thus is produced a pulse at the passage of each one of the breakthroughs 17, 18 and 19 through slot 28 and at the switching segment output A 5002 the signal will have a "high" state, while slot 28 will be between the first and second breakthroughs 17 and 18, thus situated between the first switching time point 117 and the second switching time point 118, thus signalling switching segment A. Correspondingly thereto, the signal at the switching segment output B 5003 has a "high" state between the second and the third breakthroughs 18 and 19 and thus signals the switching segment B between the second and the third switching time points 118 and 119; in the same manner, switching segment C at the switching segment output C 5004 between the third and the first switching time point 119 and 117 is signalled. The arrangement represented in FIG. 7 can, of course, be equipped with the most favorable components available at the moment.

The advantageous execution of the photosensor assemblies with only one photoelectric receiver 220 in the examples illustrated in FIGS. 8 and 9 will only be successful if, on movement of the slot 28 in the movement direction 47, the switching segments A and B between the breakthroughs 17 and 18 as well as 18 and 19 are practically equal, but the switching segment C between the third and the first breakthroughs 19 amd 17 is clearly disproportional to the switching segments A and B. Since only the switching segments A and B are important to the measuring process, it is desirable to keep their participation in the scanning cycle as large as possible; for this reason, the above described exploitation of the measuring results during the switching segment C is to be carried out in a relatively short time in order to provide a possibly favorable signal-noise relationship. It is thus favorable and a precondition for the switching-time point detectors 51 corresponding to FIG. 1, after FIGS. 8 and 9, to form the distance between the three slot-formed breakthroughs 17, 18 and 19 larger than one-third and smaller than half of the distance between two neighboring slits 28 of the movable slotted carrier 13, wherein such slot carrier 13 may be a disc, as represented in FIG. 6, or an unending band or yet an oscillating lens.

An assembly according to FIG. 8 makes it possible, under existing conditions and by using these conditions, to assign correctly, using only one photoelectric receiver 220, the switching time points 117, 118 and 119 to the slot-formed breakthroughs 17, 18 and 19.

The clock generator 40, whose pulse frequency is synchronized with the velocity of slot 28 by means of devices and connections that have not been illustrated in detail, is also connected to the counter input 5221 of a settable counter 522. A set point adjuster 520 for a fixed or a selectable binary-coded pulse number is connected to as least as many lines as required by the bits for the binary-coded pulse number, to the setting inputs 5223 of the first settable counter 522. In the example there have been drawn four signal connections for, for instance, a number tetrad. The photoelectric receiver 220 is connected as well as with the setting order input 5222 of the settable counter 522 as also over an input of an OR member 524 with the clock input 5211 of a three-step ring counter 521 and, besides, with the switching time point exit 5001, wherein also the pulse transfer output 5224 of the settable counter 522 is in contact, over an input of the AND member 523 as well as with the output connection of this AND member 523 with a second input of the OR member 524 and also in contact with the pulse input 5211 of the three-step ring counter 521. The ring counter 521 has been represented with the usual, unnumbered, return lines, and its output of the first step 5216 is connected to the switching segment output A 5002, its exit to the second step 5217 is connected to the switching segment output B 5003, and its output of the third step 5218 is connected to the other input of AND member 523 as also to the switching segment output C 5004.

The pulses of the photoelectric receiver 220 that initially have not been attributed to the breakthroughs 17, 18 and 19 of mask 14 (as in FIG. 7) reach, firstly, directly the switching time point output 5001 and, secondly, the pulse input of ring counter 521, through whose three steps a logical "1" in the represented loop at every pulse of the photoelectric receiver 220 is pushed by one step to the right in the circle, wherein such logical "1", to begin with, may have any position in relation to the switching time points 117, 118 and 119.

Besides, the pulses from the photoelectric reveiver 220 reach the setting-order input 522 and set the counter 522 with the binary-coded pulse number n, which originate from the set point adjuster 520 at the setting entries 5223. This pulse number n must be selected in such a way that it be larger than the number of pulses coming from clock generator 49, which correspond to the switching segment C between the third and the first switching time points 119 and 117, and be smaller than the number of pulses which are attributed to the switching segment A or B between the switching time points 117 and 118 or 118 and 119. The settable counter 522 is usually a back-counter which will deliver a pulse to its transfer pulse output 5224 when the number of pulses from the clock generator 49 is equal to the number of pulses n set or larger, but does not deliver a pulse, if the counter before reaching the pulse number n is set anew by a pulse of the photoelectric receiver 220. When now at the ring counter 521 the logical "1" happens to be positioned at the third step, then, for example at the output of the third step 5218, a "high" signal will form, releasing AND member 523.

If slot 28 happens to be in switching segment C, then the number of pulses from clock generator 49 is smaller than the set number of pulses n, and counter 522 will not deliver a transfer signal so that ring counter 521, which happens to be positioned at the right place of attribution to the switching segments, is only pushed forward correctly by the pulses of the photoelectric receiver 220, not being then corrected. However, if the ring counter is not correctly attributed to the switching segments, then, when the logical "1" is again in the third step, but slit 28 is, for instance, in switching segment A, the following correction is made:

The number of pulses coming from clock generator 49 is greater than the pulse number n set and the transfer pulse of counter 522 is then an additional pulse, which over AND member 523 and OR member 524 reaches the clock input 5211 of ring counter 521, sliding the logical "1" into the first step, which is attributed to switching segment A. Correction of the ring counter is thus finalized. When switching segment B is in the same position as the logical "1" in the third step, then, as described, two correcting steps are necessary.

Since these corrections are processed at the switching on and warming up of the whole arrangement, they exercize no influence whatsoever during operation.

The arrangement represented in FIG. 8 has advantages for a hardware execution, while the following arrangement represented in FIG. 9, which serves the same purpose, will be more advantageous when computerized components are provided.

FIG. 9 shows an erasable binary counter 530 in which the count input is connected to a clock generator 49 whose pulse frequency, as described above, is synchronized with the speed of slot 28, with the aid of means and connections that have not been represented in detail. The photoelectric receiver 220 is connected over a delay device 531 to the erasing input of the binary counter 530 as well as directly to a transfer input 5332 of an erasable storage 533 for binary-coded numbers and, moreover, with the signal pulses of a first, second and third pulse storages 534, 535 and 536 as well as to the switching time output 5001. The data outputs of binary counter 530, whose number corresponds to the necessary significant bits of a binary-coded number (here, as an example, four connections have been drawn in), are connected to the first inputs 5321 of a comparator 532 for binary-coded numbers, as also to the data inputs of storage 533, and correspondingly also the data outputs 5333 of storage 533 are connected with second inputs of comparator 532. At the comparator, an output 5323 for "greater than" is connected to the data input of the first pulse storage 534 (with a D-flip-flop this is the D-input), an output for "equivalent" to the data input of the second pulse storage 535 and an output for "smaller than" to the data input of the third pulse storage 536. In the pulse storages, the output of the first 534 is connected to the switching segment output A 5002 as also to the erasing input of the third pulse storage 536; the output of the second pulse storage 535 to the switching segment output B 5003 as also to the erasing input of the first pulse storage 534, and the output of the third pulse storage 536 to the switching segment output C 5004 as also to the erasing input of the second pulse storage 535.

Concerning the mode of operation of the arrangement according to FIG. 9, there is a marked similarity in the mode of operation regarding the three pulse storages 534, 535 and 536 or 504, 505 and 506 of FIG. 7 so that the explanations given in connection with FIG. 7 prevail for the present case. The data inputs of pulse storages 534, 535 and 536 are, however, activated by the three outputs of the comparator, instead of the three photoelectric receivers 221, 222 and 223. As a deciding criterion for the attribution of the output pulses of the photoelectric receiver 220 to the switching time points 117, 118 and 119, one may use the comparison between two successive binary numbers in their significant bits since these are equivalent for the succession of switching segments A and B, while for the succession of the switching segment from C to B the succeeding binary number is smaller than the preceding one, and in the succession of switching segment from A to C, the next binary number is larger than the preceding one. In the example of a switching arrangement, a delay is introduced shortly before the end of each switching segment A, B or C, i.e., after each of the switching time points 117, 118 and 119, the count content of binary counter 530 is erased, which, however, shortly before the time moment of the switching time points 117, 118 and 119 is taken over into storage 533 as the binary number of the just finalized switching segment, wherein such binary number corresponds in each case to the length of the corresponding switching segment. In the following operating switching segment A or B or C, the binary counter 530 is filled by the clock generator 49, and comparator 532 compares the current content of binary counter 530 with the content of storage 533. Here, at the outputs of comparator 532, there may successively appear, for example, a "high" signal at the output 5323 for "smaller than", possibly thereafter also at the output for "equivalent" or also at the output for "greater than", until the next pulse of the photoelectric receiver 220 takes over the "high" signal from the output of comparator 522 that has been reached into one of the pulse storages 534, 535 or 536, and thereby to the corresponding switching segment output 5002 or 5003 or also 5004.

The preceding arrangements, especially those with just one photoelectric receiver 220, have, to be sure, been planned as embodiments of the present invention; they may, however, also be advantageously utilized in connection with the usual two-beam devices, if the aforedescribed conditions are provided to this effect.

For securely obtaining the described significant bit (since because of unavoidable tolerances at pulse counting, the low-value bits have to be suppressed in order that comparator 532 may always deliver an unequivocable message), it is recommendable that a favorable code be selected for the output of the binary counter 530, for example the known Gray Code.

We claim:

1. In an arrangement for the automatic adjustment of at least one object, in a photoelectric measuring and scanning system wherein the object is provided with adjustment marks having at least one symmetrical axis, the marks being illuminated by a light source and reproduced by optical systems with a common optical axis on the scanning plane of the photoelectric measuring and scanning system, the video signal of the measuring and scanning system being processed electronically, evaluated by an arithmetic unit and converted into control signals for at least one final control element that provides the adjustment; the improvement wherein a first means is provided for activating first and second image segments separated by a stationary axis in the scanning plane of the photoelectric measuring and scanning system, said image segments having substantially the same formation and being assembled opposite to each other on the stationary and optical axis and parallel to the symmetrical axis of the adjustment marks, a second means being provided in the photoelectric measuring and scanning system for enabling periodic scanning vertially of the stationary axis, and a switching time point detector connected to the photoelectric measuring and scanning system for presetting first, second and third switching time points, between which the two image segments are alternately employed for video signal production, a time base clock generator connected to said second means, said switching time point detector being a component of a channel control arrangement, the measuring and scanning system and also the channel control arrangements being connected at their outputs to a sequential video signal processing arrangement, and an arithmetic unit comprising at least one memory operable in two function groups and at least one arithmetic arrangement having an output providing a control signal for rule deviation to said final control element.

2. An arrangement according to claim 1, wherein the photoelectric measuring and scanning system is a television camera, the second means is a column deflection unit known per se, which besides the usual line deflection unit comprises at any given moment a corresponding column and line toothsaw generator, the running direction of the column flows in a right angle to the stationary axis, the channel control arrangement consisting of a first, a second and a third comparator, of which each, in addition, has a negated output; a first, a second, a third and a fourth NAND member, an AND member, a NOR member and a multiple comparative value setter, in each case with a first, fourth and seventh voltage connection in ascending sequence for a comparator, the column toothsaw generator and the line toothsaw generator being synchronously connected to the clock generator, and first, fourth and seventh voltage connections of the multiple comparative value setter connected in ascending sequence at a time to the first, the second and the third comparator, and each of the second inputs of the first, the second and the third comparator among each other and to a voltage-dependent connection of the column-deflecting unit and, one input of the first NAND member being connected to the negated output of the first comparator and, the other input of the first NAND member being connected to the nonnegated output of the second comparator and one input of the second NAND member being connected to the negated output of the second comparator and the output of the first NAND member being connected to one input of the AND member and the inputs of the third NAND member and the output of the second NAND member is connected to the other input of the AND member and the inputs of the fourth NAND member and the output of the third NAND member is connected to the first input of the NOR member and the connecting point for switching segment output A and the output of the fourth NAND member is connected to the second input of the NOR member and to the connecting point for the switching segment output B and the output of AND member is connected to the third input of the NOR member and the connecting point for the switching segment output C and the output of the NOR member is connected to the connecting point for the switching segment output B.

3. An arrangement according to claim 1, wherein the first means is an analog signal gate switching which has a lockable analog signal channel with an input and an output and a lockable input; that in the analog signal gate switching the input is connected to the video signal output of television camera and the output is connected to the connecting point for an output for the analog video signal of the photoelectric measuring and scanning system, the first means in combination with the channel control arrangement comprising a fourth to a ninth comparator, each with an additional negated output, an OR member, a second and third AND member and further voltage connections of the multiple comparative value setter, of which a second and a third, in ascending sequence, are assembled between the first and fourth voltage connections, a fifth and sixth between the fourth and seventh voltage connections, in each case symmetrically to the fourth voltage connection and equally symmetrically thereto an eighth and ninth voltage connection, that from the multiple comparative value setter of the second voltage connection with the first input of the fourth comparator, the third voltage comparator with the first input of the fifth comparator, the fifth voltage connection with the first input of the sixth comparator, the sixth voltage connection with the first input of the seventh comparator, the eighth voltage connection with the first input of the eighth comparator, the ninth voltage connection with the first input of the ninth comparator, and each of the second inputs of the fourth, of the fifth, of the sixth and the seventh comparator is connected to the voltage-dependent line of the column-deflecting unit, and each of the second inputs of the eighth and ninth comparator is connected to a voltage-dependent line of the line-deflecting unit and, in the second AND member, one input is connected to the negated output of the fourth comparator, the other input is connected to the nonnegated output of the fifth comparator and the output is connected to the input of the OR member, and, in the third AND member, one input is connected to the nonnegated output of the sixth comparator, the other input is connected to the nonnegated output of the seventh comparator and the output is connected to the second input of OR member, in the fourth AND member, one input is connected to the negated output of the eighth comparator, the other input is connected to the nonnegated output of the ninth comparator and the output is connected to the third input of the OR member and the output of the OR member is connected to the locking input of the analog signal gate switching.

4. An arrangement according to claim 1, wherein the first means is a light-permeable pair of template windows provided as adjustment marks on the second object in the form of a first and a second template window, which are similarly formed and are arranged on an axis of template window pairs opposite each other, being separated by a light-impermeable, intermediate rod, this pair of template windows being reproduced onto the adjustment marks of the first object and, together with such object, on the scanning plane of the photoelectric measuring and scanning system in such a way that the axis for the pair of template windows and the stationary axis flow substantially parallel in the direction of the stationary axis the coverage of each template window being larger than the coverage of the image segments, and perpendicular to the stationary axis smaller than the coverage of the image segments there being provided a further final control element for the adjustment of the second object to the photoelectric measuring and scanning system and a controllable mode-of-operation switch for the control signal in rule deviation whose two outputs are each connected to the first and the second final control element, whose signal input is connected to the output of an arithmetic unit, and whose control input is connected to a mode-of-operation selection arrangement.

5. An arrangement according to claim 4, wherein the sequential image processing arrangement and the arithmetic unit are provided with means for structure recognition and position determination of dark image elements, that the sequential image processing arrangement comprises a video signal comparator, an image-level adjuster, a negator serving as NAND member, a NAND member serving as switch, an AND member serving as gate, an AND member serving as pulse comparator and an OR member, that in the video signal comparator one input is engaged with the image level adjuster, the other input is engaged with the output for the analog video signal of the photoelectric measuring and scanning arrangement and the output is engaged with one input of the negator as also with one input of the gate and, in the changeover switch, the input is engaged with the mode-of-operation selection arrangement as also with the other input of gate, the output being engaged with the other input of negator and, in the OR member, one input is engaged with the output of the negator, the other input is engaged with the output of the gate and the output is engaged as well as with the first arithmetic unit input for the binary video signal as also with the input of the pulse comparator and, in the pulse comparator, the other input is connected to the clock generator and the output is connected to a second arithmetic unit input for the video signal pulse in such a way that in a switching position for an adjustment of the first object vis-a-vis the second object the output of the video signal comparator is directly connected to the first computer input and in the switching position for the adjustment of the second object to the photoelectric measuring and scanning system the output of the video signal comparator is connected to the first arithmetic unit input over the negator.

6. An arrangement according to claim 1, wherein the first means is a light-impermeable mask with first and second image eruptions.

7. An arrangement according to claim 6, wherein the second means is a flexible slotted carrier with a drive motor comprising an activation arrangement provided adjacent to the mask; the measuring and scanning system comprising only one photoelectric converter, which assembled in the beam path with the optical axis for the two image eruptions and having a video signal output; the switching time point detector having at least one further source of light, first, second, and third slit-shaped breakthroughs assembled on the mask, the slotted carrier and at least one photoelectric receiver, which is attributed to a beam path with an optical axis for the slit-shaped breakthroughs, wherein the direction of the slits in the slit-shaped breakthroughs and of the slit of the slotted carrier active at any given moment flows parallel to the stationary axis and, the slit of the slotted carrier active at any given moment having a flow direction which, successively, covers a first breakthrough, a first image breakthrough, a second breakthrough, a second image breakthrough and a third breakthrough.

8. An arrangement according to claim 7, wherein the switching time point detector comprises a first, a second, and a third photoelectric receiver with a logically processable output signal, an OR member, the channel control arrangement of a first, second and a third erasable pulse memory each being provided with a data and transfer input, the first photoelectric receiver being connected to the first input of an OR member as well as to the data input of the second pulse storage, the second photoelectric receiver being connected to the third input of the OR member as well as to the data input of the third pulse storage, the transfer inputs of the first, second and third pulse storage being connected among themselves and to the output of the OR member, in the first pulse storage, the output being connected to the erasing input of the third pulse storage and also to the connecting point for a switching segment exit A, in the second pulse storage, the output is connected to the erasing input of the first pulse storage to the connecting point for a switching segment output B, in the third pulse storage, the output is connected to the erasing input of the second pulse storage and also to the connecting point for a switching segment output C, and the output of the OR member is connected to the connecting point for a switching time point output.

9. An arrangement according to claim 7, wherein in the switching time point detector the distance of the three slit-shaped eruptions from each other is larger than one-third and smaller than half of the distance between two neighboring slits of the movable slotted carrier, the three slit-shaped eruptions having only one photoelectric receiver attributed to them, the photoelectric receiver having a logically processable output signal.

10. An arrangement according to claim 9, wherein the channel control arrangement comprises a three-stepped ring counter, a settable counter, a should-be value setter matching the counter, an AND member and an OR member, the settable counter having a counting input connected to the clock generator, a setting order input is connected to the photoelectric receiver, setting inputs are connected to the should-be value setter and a transfer pulse output is connected to one input of AND member as well as, in the ring counter, a pulse input is connected to the output of an OR member, the output of a first step is connected to the connecting point for the switching segment output A, the output of a second step is connected to the connecting point for the switching segment output B and the output of a third step is connected to the other input of the AND member, as well as in the OR member, one input is connected to the photoelectric receiver and also to the connecting point for the switching time point output of the channel control arrangement and the other input is connected to the output of the AND member and also to the connecting point for the switching segment output C, and that the binary-coded pulse number of the should-be value setter is larger than the pulse number of the clock generator between the third and the first switching time point and smaller than the pulse number of the clock generator between the first and the second switching time point.

11. An arrangement according to claim 9, wherein the channel control arrangement comprises an erasable binary counter, a delaying member, a comparator for binary-coded numbers and outputs for "larger than", "equivalent" and "smaller than", an erasable storage for binary-coded numbers as well as a first, a second and a third erasable pulse storage, each provided with an input for data and take-overs, for instance a D-flip-flop, that in the erasable binary counter the counting input is connected to the clock generator, the erasing input is connected over the delaying member to the photoelectric receiver and the results outputs are connected to the first inputs of comparator and to the results inputs of storage, and in storage a take-over entry is connected to the photoelectric receiver and results outputs are connected to the second inputs of comparator, in comparator one output for "larger than" is connected to the data input of the first pulse storage, the output for "equivalent" is connected to the data input of the second pulse storage and the output for "smaller than" is connected to the data input of the third pulse storage, in the first pulse storage the pulse input is connected to the pulse input of the second pulse storage and to the pulse input of the third pulse storage and also to the photoelectric receiver and, additionally, to the connecting point for the switching time point output and the output of the first pulse storage is connected to the erasing input of the third pulse storage and to the connecting point for the switching segment output A in the second pulse storage the output is connected to the erasing input of the first pulse storage and to the connecting point for the switching segment output B, in the third pulse storage the output is connected to the erasing entry of the second pulse storage and to the connecting point for the switching segment output C, there being connected only as many results outputs of the erasable binary counter and equally as many results outputs of the storage as there are significant bits.

* * * * *